United States Patent

Hata et al.

[11] Patent Number: 5,978,245
[45] Date of Patent: Nov. 2, 1999

[54] ASSOCIATIVE MEMORY DEVICE HAVING CIRCUITRY FOR STORING A COINCIDENCE LINE OUTPUT

[75] Inventors: Ryuichi Hata; Hiroshi Sasama; Masato Yoneda, all of Chiba, Japan

[73] Assignee: Kawasaki Steel Corporation, Hyogo, Japan

[21] Appl. No.: 08/947,877

[22] Filed: Oct. 9, 1997

[30] Foreign Application Priority Data

Oct. 17, 1996 [JP] Japan .................................. 8-274349

[51] Int. Cl.$^6$ ....................................................... G11C 15/04
[52] U.S. Cl. ................. 365/49; 365/189.05; 365/189.07; 365/230.08
[58] Field of Search ................................. 365/49, 189.05, 365/189.07, 230.08

[56] References Cited

U.S. PATENT DOCUMENTS 4,523,301  6/1985  Kadota et al. ............................. 365/49

FOREIGN PATENT DOCUMENTS 61-31558   7/1986   Japan .
2-18790    1/1990   Japan .
7-105689   4/1995   Japan .
8-106788   4/1996   Japan .
8-124386   5/1996   Japan .

*Primary Examiner*—Andrew Q. Tran
*Attorney, Agent, or Firm*—Oliff & Berridge PLC

[57] ABSTRACT

An associative memory device in which a coincident output is held by each word and aging for word data can be efficiently performed such that the word data is made valid or invalid on the basis of the information. The associative memory device includes a plurality of words for storing data, for detecting the coincidence/non-coincidence between the data stored in the plurality of respective words and input search data. Each word further includes a memory for storing a coincidence line output by a searching operation, a storage memory for storing data representing whether the corresponding word is subjected to a searching operation or is available to write new data therein, a circuit for simultaneously setting/resetting the contents of the storage memory, and circuit for resetting/setting the memory for storing the coincidence line output by the storage memory.

8 Claims, 3 Drawing Sheets

ASSOCIATIVE MEMORY DEVICE HAVING CIRCUITRY FOR STORING A COINCIDENCE LINE OUTPUT

BACKGROUND OF THE INVENTION

1. Field of the Invention

The present invention relates to an associative memory device, having a plurality of words for storing data, for detecting the coincidence/non-coincidence between the data stored in the respective words and input search data in the plurality of words.

2. Description of the Related Art

A circuit block diagram showing an associative memory device having the search function described above is shown in FIG. 3.

This associative memory device 100 comprises a large number of memory words 110, 120, . . . , constituted by a plurality of associative memory cells. The associative memory device 100 also comprises a search register 160 in which search data are stored. The bit pattern of all or predetermined part of the search data stored in the search register are compared with the bit pattern of a corresponding part of data stored in the memory words to check the coincidence/non-coincidence therebetween. Coincidence/non-coincidence signals are output to coincidence lines 111, 121, . . . , arranged for the respective memory words.

The signal of the coincidence line is input to a priority encoder 170. The priority encoder outputs an address signal 171 corresponding to a memory word, having the highest priority, of the memory words to which the coincidence signals are output.

Since such an associative memory device has a price per bit which is higher than a conventional memory device, maintenance for word data is necessarily performed. More specifically, data to be searched are not stored in all the memory words constituting the associative memory device, and some memory words do not have valid data stored therein and are set in an empty state. New valid data may be written in the memory words set in the empty state. In this case, it is very complicated that memory words set in the empty state are managed by an external device.

As an associative memory device to solve the above problem, as disclosed in Japanese Examined Patent Publication No. 61-31558, an associative memory device having the following arrangement is known. Storage circuits (empty bits) for storing whether words are allowed to write information therein are arranged for the respective words, so that the information can be written in the words allowed to write information therein in the device without address management by an external device.

As disclosed in Japanese Unexamined Patent Publication No. 2-18790, an associative memory device which can control whether a word is to be searched by an empty bit (whether a coincidence output is made or not) is known.

In the associative memory device, when unnecessary word data left a predetermined period of time after registration or a coincidence output is made, the empty bit of the word to be erased is reset. For this purpose, a specific word must be selected by address designation. Although the later associative memory device has a simultaneous reset function for empty bits, the associative memory device does not have a function of simultaneously resetting only a plurality of specific words.

Associative memory devices which are proposed by the present applicant in Japanese Unexamined Patent Publication Nos. 7-105689, 8-106788, and 8-124386 will be described below with reference to FIG. 4. Each of these applications proposes an associative memory device having an empty flag register 220 for storing whether a word is allowed to write information therein, a hit hysteresis flag register 230 for storing whether a word is a word in which coincidence is detected at least once in previous searching operations, and a storage state change circuit 240 in which flags stored in the empty flag register 220 are changed from a valid state to an invalid state depending on the hit hysteresis at once, or for respective words, or for respective sets of words.

In the associative memory device having conventional empty bits, in order to reset the empty bit of a specific word, a corresponding word must be selected by address designation. In addition, when there are a plurality of corresponding words, selecting and erasing operations by address designation must be repeated. For this reason, the associative memory device has problems that complex control must be performed for address designation and that a high-speed operation cannot be easily achieved.

Since an empty bit and a circuit for controlling the empty bit are required for each word, it is important for obtaining a high integration density to decrease the number of elements for realizing these functions. However, a prior art concerning this technique is not actually disclosed.

Furthermore, in the associative memory device proposed by the present applicant, as a means for realizing empty flags and hit hysteresis flags is constituted by a flip-flop having a set/reset function and some logic circuits. Since these circuits are required for each word, a circuit arrangement disadvantageously increases in size.

For a high-speed operation, a coincidence line output (251 in FIG. 4) is held, and bit lines and coincidence lines of the respective words must be initialized for a next searching operation during a priority encoder processing. For this reason, another hit flag must be arranged independently of the hit hysteresis flag, and the circuit further increases in size disadvantageously.

In a general associative memory device has a mechanism which receives a coincidence line output or a signal of a hit flag holding the coincidence line output to cause a priority encoder to encode a hit address. In the conventional associative memory device, upon completion of the searching operation, a coincidence line output is reset for a next searching operation. Words having hit flags hold the hit flags until the next searching operation is performed. For this reason, when the coincidence states of valid words are checked after coincidence words are made invalid, a searching operation must be performed again. Of a series of operations in the associative memory device, the searching operation requires a processing time and current consumption. For this reason, a re-searching operation for only checking a coincidence state degrades the performance of the system. Therefore, when a word is made invalid, if the hit flag of the word can be reset (incoincidence state), a coincidence state after the word is made invalid can be checked by operating a priority encoder. A processing speed of the system can be increased, and current consumption of the system can be reduced.

SUMMARY OF THE INVENTION

A demand for an increase in capacity (multi-word arrangement) in an associative memory device gradually increases every year. In order to realize this, it is important to decrease the number of elements constituting empty bits and circuits for controlling the empty bits and to make control of maintenance for words easy.

It is an object of the present invention to solve the problems in the prior art and to provide an associative memory device in which a coincidence output is held by each word, word data is made valid/invalid on the basis of information to efficiently perform maintenance for the word data, and these functions can be realized with a small number of elements. In addition, when the coincidence output is held by each word, the bit line and the coincidence line of each word can be rapidly initialized. For this reason, a cycle time can be shortened, i.e., a searching operation can be performed at a high speed.

In order to achieve the above object, according to the present invention, there is provided an associative memory device, having a plurality of words for storing data, for detecting the coincidence/non-coincidence between the data stored in the plurality of respective words and input search data, characterized in that each word comprises: means for storing a coincidence line output by a searching operation; storage means for data representing validity that the corresponding word is subjected to a searching operation or invalidity that the corresponding word is allowed to write new data therein; means for simultaneously setting/resetting the contents of the storage means for the data representing the validity/invalidity of the word according to the contents of the means for storing the coincidence line output; and means for resetting/setting the means for storing the coincidence line output by the storage means for the data representing the validity/invalidity of the word.

Here, each word preferably comprises means for selecting whether the means for storing the coincidence line output is set or reset according to the contents of the storage means for the data representing the validity/invalidity of the word. Each word comprises means for detecting a searching operation, an operation of updating the contents of the storage means for the data representing the validity/invalidity of the word, and an operation of reading the contents, and the selecting means for selecting the setting/resetting of the means for storing the coincidence line output activates the means for setting/resetting the coincidence line output when a searching operation is performed and when the contents of the storage means for the data representing the validity/invalidity of the word are updated into data representing the invalidity. When the contents of the storage means for the data representing the validity/invalidity of the word are updated into data representing the validity, and the contents are read, the means for setting/resetting the coincidence line output is preferably inactivated.

The associative memory device preferably comprises means for activating means for, when the storage means for the data representing the validity/invalidity of the word is constituted by a latch circuit having a memory type and when data representing that the word is made invalid is written in the storage means, detecting the operation as a write operation to set/reset the means for storing the coincidence line output. The associative memory device preferably comprises means for inactivating means for, when the contents of the storage means for the word data are read, detecting the operation as a read operation to set/reset the means for storing the coincidence line output.

The storage means for the data representing the validity/invalidity of the word is preferably constituted by a latch circuit having a memory type and controlled by a word line shared with word data. Compared with the case wherein the storage means is controlled by a signal line which is independent of the word data, the number of circuits constituting the device can be reduced, and the number of wires in a layout of one word can be reduced. For this reason, a high integration density can be achieved.

The associative memory device preferably comprises means for, when the contents of the storage means for the data representing the validity/invalidity of the word are simultaneously set or reset according to the contents of the means for storing the coincidence line output, inactivating the means for resetting/setting the coincidence line output by the storage means for the data representing the validity/invalidity of the word during the setting/resetting operation and activating the means for resetting/setting the coincidence line output upon completion of the setting/resetting operation.

More specifically, the associative memory device preferably comprises: means for detecting or finding a search operation, an updating operation for the contents of the storage means for the data representing the validity/invalidity of the word, a reading operation, and an operation for simultaneously setting/resetting the contents of the storage means for the data representing the validity/invalidity of the word according to the contents of the means for storing the coincidence line output; and means for selecting whether the means for storing the coincidence line output is set or reset according to the contents of the storage means for the data representing the validity/invalidity of the word, wherein the former detection means preferably controls the later selection means. The latch circuit having a memory type and constituting the storage means for the data representing the validity/invalidity of the word preferably uses a word line shared with the word data.

DESCRIPTION OF THE PREFERRED EMBODIMENTS

An associative memory device according to the present invention will be described below on the basis of a preferred embodiment shown in the accompanying drawings.

According to the present invention, an associative memory device, having a plurality of words for storing data, for detecting the coincidence/non-coincidence between the data stored in the plurality of respective words and input search data basically comprises: a storage circuit (hit flag) for holding a coincidence line output in each word; a storage means (empty bit) for data representing the validity/invalidity of a word to represent whether the word is valid (subjected to a searching operation) or invalid (not subjected to a searching operation and allowed to write data therein); a means for setting (or resetting) the empty bit on the basis of a control signal and the hit flag; and a means for resetting (invalid word is not subjected to a searching operation) the hit flag on the basis of the empty bit.

An example for maintenance word data by using the associative memory device according to the present invention will be described below. Before maintenance is performed to word data, a data area for maintenance the word data is prepared independently of normal search data. A normal searching operation is performed such that this maintenance data area is masked (is not subjected to the searching operation). In contrast to this, in maintenance for data, a searching operation is performed such that a normal search data area is masked. After only a word to be erased coincides (does not coincide) with the stored word, the empty bit is set (invalid word) by the control signal and the hit flag. In this manner, a word to be erased can be erased without designating the address of the word from the outside of the device.

According to the present invention, when the associative memory device comprises a means for resetting a hit flag on the basis of a control signal obtained by an operation mode detection circuit and an empty bit, so that the empty bit is reflected in the hit flag only when it is necessary. In this manner, since the hit flag can be prevented from being reset by noise from the empty bit, the empty bit can also be constituted by a simple latch circuit having a memory type, and circuit elements can be reduced in number.

Figure 1:
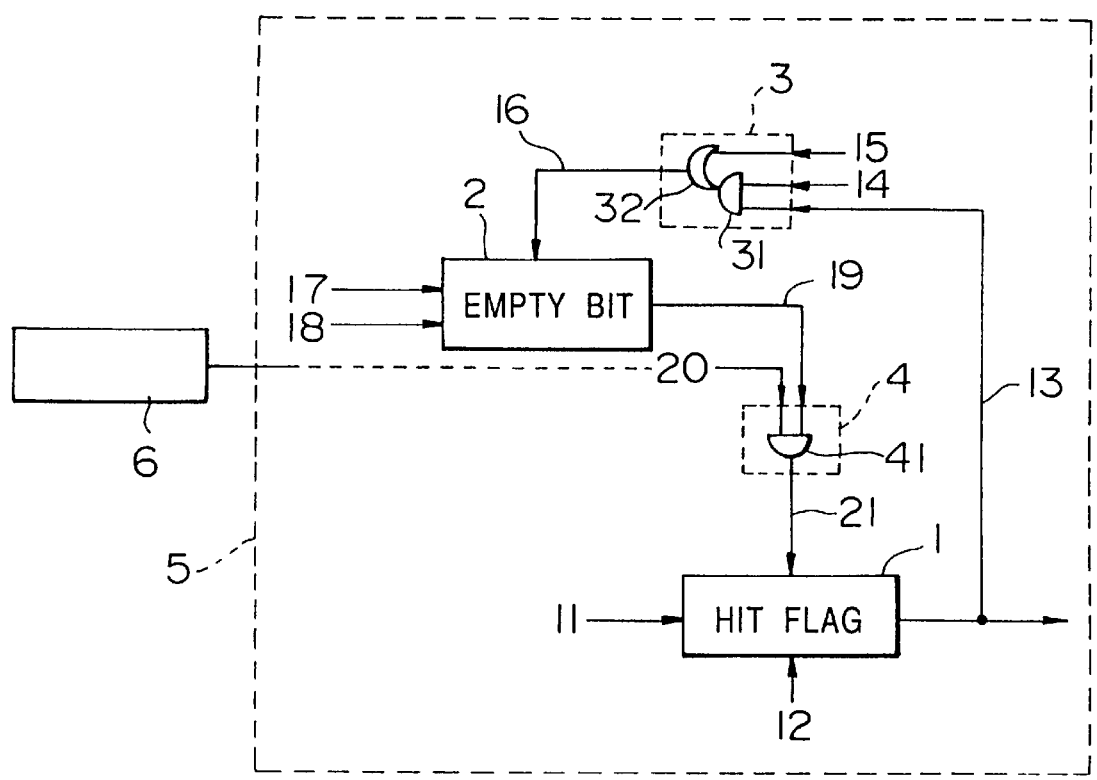
FIG. 1 is a block diagram showing an embodiment of an associative memory device according to the present invention.

FIG. 1 is a block diagram showing an embodiment of an associative memory device according to the present invention, and shows an arrangement for causing an operation mode detection circuit and a hit flag to control an empty bit and causing the empty bit to control the hit flag. A portion enclosed by a dotted line in the circuit shown in FIG. 1 is for only one word. Actually, the circuit is arranged for each word. In FIG. 1, circuits constituting a conventionally known associative memory device such as an associative memory cell array constituted by a plurality of associative memory cells arranged for each word, a coincidence detection circuit, a priority encoder, a bit line driver, an address decoder, a mask circuit, a sense amplifier, and the like are omitted.

In the associative memory device according to the present invention, reference numeral 1 in FIG. 1 denotes a hit flag serving as a means for storing a coincidence line output by a searching operation. The coincidence line output 11 is an output from a coincidence line serving as a signal line representing a search result from an associative memory cell unit (not shown) in which data is stored. Here, if stored data coincides with (hits) search data, data "1" is output. If the stored data does not coincide with the search data, data "0" is output. For this reason, data "0" stored in the hit flag 1 represents non-coincidence, and data "1" represents coincidence. Reference numeral 12 denotes an input control signal to the hit flag 1 of the coincidence line output 11. In a searching operation, in response to the input control signal 12, the coincidence line output 11 is fetched and held by the hit flag 1. Reference numeral 13 denotes a hit flag output for outputting storage data ("0": incoincidence, "1": coincidence) of the hit flag 1. If 1-bit storage data can be held, the hit flag 1 is not limited to a specific circuit. The hit flag 1 may be constituted by a flip-flop to receive the input control signal 12 as a clock, the hit flag 1 may have a latch type to receive the input control signal 12 as a control signal of the latch circuit, or the hit flag 1 may be constituted by a register.

Reference numeral 2 in FIG. 1 denotes an empty bit serving as a storage means for data representing whether a corresponding word is valid to be subjected to a searching operation or is invalid not to be subjected to a searching operation to be allowed to write new data therein. Here, data "0" stored in the empty bit 2 represents validity, i.e., that the corresponding word is a word subjected to a searching operation. Data "1" represents invalidity, i.e., that the corresponding word is not subjected to a searching operation and is allowed to write new data therein. Reference numerals 17, 18, and 19 denote an empty bit input, an empty bit data input control signal, and an empty bit output, respectively. As in a conventional using method, when valid data is written in the corresponding word, and when a word is made invalid by address designation, desired data ("0": validity and "1": invalidity) can be input from the empty bit input 17 by the empty bit data input control signal 18 and held in the empty bit 2. The empty bit output 19 outputs data ("0": valid and "1": invalid) stored in the empty bit 2.

Reference numeral 3 denotes an empty bit controller serving as a means for simultaneously setting/resetting the contents of the empty bit 2 serving as a storage means for the data representing the validity/invalidity of the corresponding word according to the contents of the hit flag 1 serving as a means for storing the coincidence line output 11. The empty bit controller 3 has an AND gate (AND) 31 and an OR gate (OR) 32 using the output of the AND gate 31 as one input. The hit flag output 13 is input to one input of the AND gate 31, and a hit purge signal 14 is input to the other input. An all-word purge signal 15 is input to the other input of the OR gate 32. An output of the OR gate 32 serves as an output of the empty bit controller 3 for setting/resetting the contents of the empty bit 2. As an empty bit forcible set signal 16, in this case, storage data of the empty bit 2 is forcibly set to "1" (invalid). Here, as the empty bit forcible set signal 16, "0" represents that the contents of the empty bit 2 are not set, and "1" represents that the contents are set.

In order to efficiently performing maintenance for each word data, the empty bit 2 can be forcibly set (made invalid) by the empty bit controller 3 as described above. In this embodiment, it is described that all the words are made invalid by the all-word purge signal 15 and that only a word which coincides with a word to be searched is made invalid by the hit purge signal 14. The present invention is not limited to the embodiment. A circuit for making a word valid but invalid may be used, and a circuit for making only an incoincidence word invalid or valid may be used. In the present invention, all the words are not necessarily made invalid. For this reason, when all the words are not made invalid, the all-word purge signal 15 and the OR gate 32 need not be arranged, and an output of the AND gate 31 is used as the empty bit forcible set signal 16.

Reference numeral 4 denotes a hit flag controller functioning as a means for resetting/setting the hit flag 1 serving as a means for storing the coincidence line output 11 by the empty bit 2 serving as a storage means for data representing the validity/invalidity of the word. The hit flag controller 4 has an AND gate 41. The empty bit output 19 is input to one input of the hit flag controller 4, and a reflection control signal 20 for controlling whether the contents (output 19) of the empty bit 2 are reflected in the hit flag 1 or not is input to the other input of the hit flag controller 4. Here, as the reflection control signal 20, "0" represents that the contents are not reflected in the hit flag 1, and "1" represents that the contents are reflected in the hit flag 1. Note that the reflection control signal 20 is generated by the operation mode detection circuit 6. The operation mode detection circuit 6 detects operation modes to check whether the associative memory device is set in a searching operation, an operation of writing the contents of the empty bit 2, an operation of reading the contents, or an operation of simultaneously setting/resetting the contents of the empty bit 2 according to the contents of the hit flag 1. According to the detection information, as the reflection control signal 20, for example, a reflection signal "1" or a non-reflection signal "0" is output. An output of the AND gate 41 is used as an output of the hit flag controller 4 for resetting/setting the contents of the hit flag 1. Here, as the hit flag forcible reset signal 21, storage data of the hit flag 1 is forcibly set to "0" (non-coincidence). As the hit flag forcible reset signal 21, "0" represents that the contents of the hit flag 1 are not reset, and "1" represents that the contents of the hit flag 1 are reset. When the signals 20 and 21 are determined, either of the data may be set as each of the signals 20 and 21 as a matter of course.

In the searching operation, in response to the input control signal 12, the coincidence line output 11 is fetched and held by the hit flag 1. In this case, when the reflection control signal 20 obtained by the operation mode detection circuit 6 is set to "1", the information of the empty bit 2 is reflected in the hit flag 1, and the hit flag 1 of an invalid word is set in a forcible reset state, and the hit flag 1 is set in an non-coincidence state. More specifically, this word is not subjected to the searching operation. The reflection control signal 20 functions as a means for selecting whether the hit flag 1 serving as the means for storing the coincidence line output 11 is set or reset according to the contents of the empty bit 2 serving as the storage means for the data representing the validity/invalidity of the word. In this embodiment, although reflection of the empty bit 2 in the hit flag 1 is controlled by the reflection control signal 20, an arrangement which does not use the AND gate 41, i.e., an arrangement in which the empty bit 2 is always reflected, may be used. In this case, a simple connection line may be used as the hit flag controller 4, and any controller in which the empty bit output 19 is directly used as the hit flag forcible reset signal 21 may be used as the hit flag controller 4. However, the empty bit 2 must be arranged such that a variation in output level which may erroneously reset the hit flag 1 is prevented from occurring in the empty bit output 19.

The associative memory device according to the present invention is basically arranged described above.

The associative memory device according to the present invention will be described below with reference to an embodiment.

Figure 2:
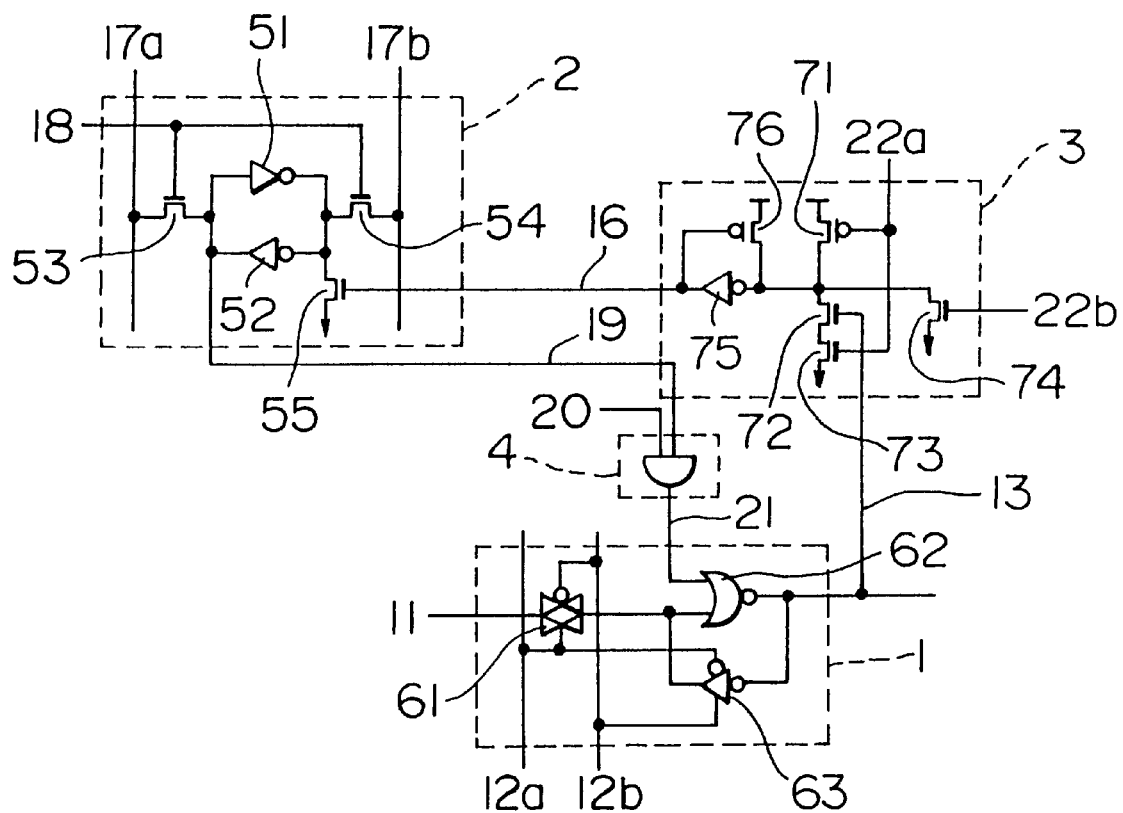
FIG. 2 is a detailed circuit diagram for realizing the associative memory device shown in FIG. 1 with elements which are as small in number as possible.
Figure 3:
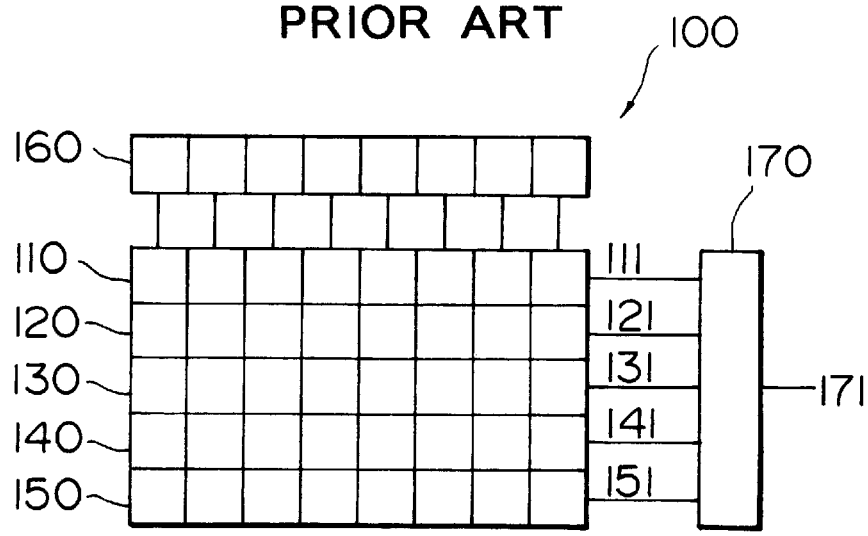
FIG. 3 is a block diagram showing a prior art of an associative memory device having a search function.
Figure 4:
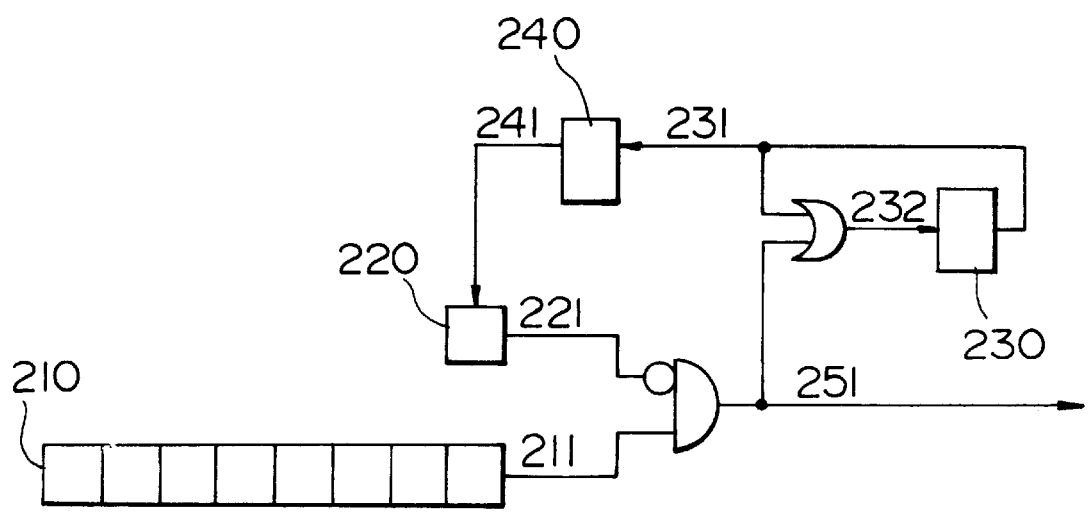
FIG. 4 shows a prior art of a storage state change circuit of an empty flag in the associative memory device.

FIG. 2 is a diagram showing a detailed circuit in which the embodiment of the associative memory device of the present invention shown in FIG. 1 is realized with elements which are as small in number as possible.

As shown in FIG. 2, it is preferable for reducing the number of elements that the empty bit 2 is constituted by a latch circuit having a memory type. The empty bit 2 constituted by the latch circuit having the memory type preferably has a circuit arrangement similar to the storage unit of an associative memory cell. The empty bit 2 comprises two inverters 51 and 52 which are cross-coupled to each other, NMOS transistors 53 and 54 connected between one of the two contact points of the inverters 51 and 52 and a data input 17a of the empty bit 2 and between the other of the two contact points of the inverters 51 and 52 and a data inversion input 17b of the empty bit 2, respectively, and an NMOS transistor 55 having one terminal (drain) connected to the contact point between the inverters 51 and 52 to which the NMOS transistor 54 is connected and having the other terminal (source) grounded. Both the gates of the NMOS transistors 53 and 54 are connected to an empty bit data input control signal 18. The gate of the NMOS transistor 55 is connected to the empty bit forcible set signal 16 serving as an output of the empty bit controller 3. The empty bit output 19 is extracted from the contact point between the inverters 51 and 52 to which the NMOS transistor 53 is connected, and is input to the hit flag controller 4.

With this arrangement, in a read operation of the empty bit 2, the potential of the empty bit output 19 may slightly vary. However, when the reflection control signal 20 input to the hit flag controller 4 is set to "0", the hit flag 1 can be prevented from being erroneously reset.

When data ("1") for making the word invalid is written in an empty bit, the reflection control signal 20 is set to "1" to set the hit flag in a reset (incoincidence) state.

The data input 17a and the data inversion input 17b of the empty bit 2 functioning as the empty bit data input 17 may be constituted by a pair of bit lines.

The hit flag 1 is constituted by a latch type. The hit flag 1 comprises: a transfer gate 61 having an input connected to the coincidence line output 11 and having a control terminal and an inversion control terminal to which latch control signals 12a and 12b of the hit flag 1 are respectively connected; a NOR gate 62 using the output of the transfer gate 61 as one input and using, as the other input, the hit flag forcible reset signal 21 serving as the output of the hit flag controller 4; and a clocked inverter 63 having an input connected to the output of the NOR gate 62, an output connected to one input of the NOR gate 62, and a control terminal and an inversion control terminal to which the latch control signals 12b and 12a of the hit flag 1 are respectively connected. The output of the NOR gate 62 is used as the hit flag output 13 and input to the empty bit controller 3. This arrangement is designed to reduce the number of elements of the hit flag 1. The latch control signals 12a and 12b of the hit flag 1 function as the input control signal 12 of the coincidence line output 11.

The empty bit controller 3 comprises: a PMOS transistor 71 having one terminal (source) connected to a power supply; series connection NMOS transistors 72 and 73 which are connected in series with the PMOS transistor 71; an NMOS transistor 74 having one terminal (drain) connected to a contact point (internal node) 23 between the PMOS transistor 71 and the NMOS transistor 72 and the other terminal (source) grounded; an inverter 75 having an input connected to the contact point 23; and a PMOS transistor 76 having one terminal (source) connected to a power supply and the other terminal (drain) connected to the contact point 23. Here, both the gates of the PMOS transistor 71 and the NMOS transistor 73 are connected to a control signal 22a, the gate of the NMOS transistor 72 is connected to the hit flag output 13, the gate of the NMOS transistor 74 is connected to a control signal 22b, and the gate of the PMOS transistor 76 is connected to the output of the inverter 75. Both the other terminals (sources) of the NMOS transistor 73 and the NMOS transistor 74 are grounded. An output from the inverter 75 is output as the empty bit forcible set signal 16 serving as an output from the empty bit controller 3 and input to the empty bit 2 (gate of the NMOS transistor 55). The control signal 22a corresponds to the hit purge signal 14 shown in FIG. 1. When both the control signal 22a and the hit flag output 13 are "1", the empty bit 2 is made invalid. The control signal 22b corresponds to the all-word purge signal 15 shown in FIG. 1. When the control signal 22b is singly "1", the empty bits 2 of all the words are made invalid. In this embodiment, an attempt to reduce the number of elements of the empty bit controller 3 is made.

With this arrangement, in order to make a word set in a coincidence state invalid, the following method is used. That is, only a word in which the hit flag output 13 is "1" when the control signal 22a is set to "1" has the empty bit forcible set signal 16 which becomes "1", and the empty bit 2 is set (made invalid). In this case, the reflection control signal 20 obtained by the operation mode detection circuit 6 is preferably set to "0", so that the hit flag output 13 is preferably prevented from being reset to "0". When the hit flag output 13 becomes "0" while the control signal 22a is "1", the contact point 23 of the empty bit controller 3 is set in a floating state to generate a through current. For this reason, the hit flag 1 is preferably reset after the control signal 22a is reset to "0".

In an initial state, when both the control signals 22a and 22b are set to "1" to set the empty bit 2 (make the word invalid), and the reflection control signal 20 is set to "1", the hit flag 1 can be reset (non-coincidence).

In the conventional memory device, when words having hit flags set to "1" (coincidence state) are designated with addresses, or simultaneously or partially made invalid, the hit flags of the words are not reset (non-coincidence state). For this reason, thereafter, a searching operation must be performed again to confirm the coincidence state.

In contrast to this, according to the present invention, when a word is made invalid, the hit flag of the word is reset. For this reason, confirmation of the subsequent coincidence state can be performed by only operating a priority encoder. As a result, a series of processing speed can be increased, and current consumption can be reduced.

In the embodiment of the present invention, since the coincidence flag 13 is held by respective words, when the bit lines and coincidence lines of the words are initialized for the next searching operation, the initialization can be started when a coincidence output is held before the operation of the priority encoder is completed. Therefore, when searching operations are continuously performed, the first-half process of the next searching operation is performed during the second-half process of a current searching operation, i.e., during an address encode process, that is, bit line drive and coincidence detection are performed. In this manner, a search throughput can be considerably increased.

Although the associative memory device according to the present invention is basically arranged as described above, the present invention is not limited to the above embodiment. Modifications and changes in design of the present invention can be effected without departing from the spirit and scope of the present invention as a matter of course.

As has been described above, according to the present invention, an associative memory device for simultaneously erasing (making invalid) a plurality of words can be realized on the basis of a means for storing a coincidence line output by a searching operation of a hit flag and a control signal. For this reason, aging for word data can be easily performed at a very high speed. In addition, since a complex address management or the like by an external device is not required, the performance of a system including the associative memory device is improved.

According to the present invention, since the above function can be realized with a small number of elements, a high integration density can be achieved, and the associative memory device can be realized at a cost lower than that of a conventional associative memory device having a function equivalent to the function described above.

What is claimed is:

1. An associative memory device, having a plurality of words for storing data, for detecting the coincidence/non-coincidence between the data stored in said plurality of respective words and input search data, wherein each word comprises: means for storing a coincidence line output by a searching operation; storage means for data representing validity that said corresponding word is subjected to the searching operation or invalidity that said corresponding word is allowed to write new data therein; means for simultaneously setting/resetting the contents of said storage means for the data representing the validity/invalidity of said word according to the contents of said means for storing the coincidence line output; and means for resetting/setting said means for storing the coincidence line output by said storage means for the data representing the validity/invalidity of said word.

2. An associative memory device according to claim 1, further comprising means for selecting whether said means for storing the coincidence line output is set or reset according to the contents of said storage means for the data representing the validity/invalidity of said word.

3. An associative memory device according to claim 2, further comprising means for detecting the searching operation, an operation of writing the contents of said storage means for the data representing the validity/invalidity of said word, and an operation of reading the contents, wherein said means for selecting activates said means for setting/resetting said means for storing the coincidence line output when the searching operation is performed and when the contents of said storage means for the data representing the validity/invalidity of said word are updated into data representing the invalidity, and said means for selecting inactivates said means for setting/resetting said means for storing the coincidence line output when the contents of said storage means for the data representing the validity/invalidity of said word are updated into data representing the validity.

4. An associative memory device according to claim 1, further comprising means for activating means for, when said storage means for the data representing the validity/invalidity of said word is constituted by a latch circuit having a memory type and when data representing that said word is made invalid is written in said storage means, setting/resetting said means for storing the coincidence line output.

5. An associative memory device according to claim 1, further comprising means for inactivating said means for setting/resetting said means for storing the coincidence line output when said storage means for the data representing the validity/invalidity of said word is constituted by a latch circuit having a memory type and when the contents of said storage means are read.

6. An associative memory device according to claim 1, wherein said storage means for the data representing the validity/invalidity of said word is constituted by a latch circuit having a memory type.

7. An associative memory device according to claim 1, further comprising means for, when the contents of said storage means for the data representing the validity/invalidity of said word are simultaneously set or reset according to the contents of said means for storing the coincidence line output, inactivating said means for resetting/setting said means for storing the coincidence line output by said storage means for the data representing the validity/invalidity of said word during the setting/resetting operation, and activating said means for resetting/setting said means for storing the coincidence line output upon completion of the setting/resetting operation.

8. An associative memory device according to claim 1, wherein an initializing operation for the bit line and the coincidence line of each word is started when the coincidence line output is held in said means for storing the coincidence line output.

* * * * *